US011496240B1

(12) United States Patent
Hunter (10) Patent No.: US 11,496,240 B1
(45) Date of Patent: Nov. 8, 2022

(54) ITERATIVE DECODING TECHNIQUE SYSTEM AND METHOD FOR DIGITAL SELECTIVE CALLING

(71) Applicant: The Aerospace Corporation, El Segundo, CA (US)

(72) Inventor: Matthew Thomas Hunter, Ashburn, VA (US)

(73) Assignee: The Aerospace Corporation, El Segundo, CA (US)

( * ) Notice: Subject to any disclaimer, the term of this patent is extended or adjusted under 35 U.S.C. 154(b) by 0 days.

(21) Appl. No.: 17/327,493

(22) Filed: May 21, 2021

(51) Int. Cl.
*H04L 1/00* (2006.01)
*H04W 4/90* (2018.01)
*H03M 13/29* (2006.01)

(52) U.S. Cl.
CPC ...... *H04L 1/0055* (2013.01); *H03M 13/2957* (2013.01); *H04L 1/0005* (2013.01); *H04W 4/90* (2018.02)

(58) Field of Classification Search
CPC .............. H04L 1/0055; H04L 1/0005; H03M 13/2957; H04W 4/90
See application file for complete search history.

(56) References Cited

U.S. PATENT DOCUMENTS

| | | | | |
|---|---|---|---|---|
| 6,807,239 | B2 * | 10/2004 | Sugimoto | H03M 13/3961 714/746 |
| 10,153,892 | B2 * | 12/2018 | Kliewer | H04L 27/12 |
| 10,374,853 | B2 * | 8/2019 | Günturkun | H04L 25/03057 |
| 2002/0046378 | A1 * | 4/2002 | Sugimoto | H03M 13/3961 714/746 |
| 2016/0127037 | A1 * | 5/2016 | Cavaliere | H03M 13/2957 398/25 |
| 2017/0094489 | A1 * | 3/2017 | Petkus | H04W 4/02 |
| 2018/0019862 | A1 * | 1/2018 | Kliewer | G01D 4/00 |

OTHER PUBLICATIONS

Global Maritime Distress and Safety System (GMDSS)—Part 3: Digital Selective Calling Equipment—Operational and Performance Requirements, Methods of Testing and Required Testing Results, IEC International Standard, IEC 61097-3, Edition 2.0, Oct. 2017, 266 pages.
"Digital Selective-Calling System for Use in the Maritime Mobile Service", International Telecommunications Union—Radiocommunication (ITU-R), Recommendation ITU-R M493-15, Jan. 2019. [Online]. Available: https://www.itu.int/rec/R-REC-M.493-15-201901-I/en, 64 pages.

* cited by examiner

*Primary Examiner* — Thien Nguyen
(74) *Attorney, Agent, or Firm* — Duane Morris LLP (57) ABSTRACT

System and methods are disclosed that comprise receiving at least one signal via a receiver. The at least one signal is extracted for data via a processor coupled to the receiver, wherein the data includes at least one message and a set of parameters related to the message. A signal output is generated using the at least one message and the set of parameters such that the signal output includes a first portion and a second portion. At least one error is identified in the signal output and corrected using the first portion and the second portion. An output is generated that is used to perform at least one task related to the at least one signal.

20 Claims, 8 Drawing Sheets

| Character Type | Character (Encoded Symbol): $N_1$ = 10 bits Formed by appending 3-bit zero count to information symbol | | | | | | | | | |
|---|---|---|---|---|---|---|---|---|---|---|
| | Information Symbol $K_1$ = 7 bits | | | | | | | Zero Count $N_1 - K_1$ = 3 bits | | |
| Character 1 (Format Specifier) | $u_{1,1}$ | $u_{1,2}$ | $u_{1,3}$ | $u_{1,4}$ | $u_{1,5}$ | $u_{1,6}$ | $u_{1,7}$ | $z_{1,1}$ | $z_{1,2}$ | $z_{1,3}$ |
| Character 2 (Message Specific) | $u_{2,1}$ | $u_{2,2}$ | $u_{2,3}$ | $u_{2,4}$ | $u_{2,5}$ | $u_{2,6}$ | $u_{2,7}$ | $z_{2,1}$ | $z_{2,2}$ | $z_{2,3}$ |
| ... | ... | ... | ... | ... | ... | ... | ... | ... | ... | ... |
| Character $K_2$ (EOS) | $u_{K_2,1}$ | $u_{K_2,2}$ | $u_{K_2,3}$ | $u_{K_2,4}$ | $u_{K_2,5}$ | $u_{K_2,6}$ | $u_{K_2,7}$ | $z_{K_2,1}$ | $z_{K_2,2}$ | $z_{K_2,3}$ |
| Error Check Character (ECC) | $p_1^i$ | $p_2^i$ | $p_3^i$ | $p_4^i$ | $p_5^i$ | $p_6^i$ | $p_7^i$ | $z_{K_2+1,1}$ | $z_{K_2+1,2}$ | $z_{K_2+1,3}$ |

| Character Type | Character (Encoded Symbol): $N_1 = 10$ bits  Formed by appending 3-bit zero count to information symbol ||||||| ||| |
| --- | --- | --- | --- | --- | --- | --- | --- | --- | --- | --- |
| | Information Symbol  $K_1 = 7$ bits ||||||| Zero Count  $N_1 - K_1 = 3$ bits |||
| Character 1 (Format Specifier) | $u_{1,1}$ | $u_{1,2}$ | $u_{1,3}$ | $u_{1,4}$ | $u_{1,5}$ | $u_{1,6}$ | $u_{1,7}$ | $z_{1,1}$ | $z_{1,2}$ | $z_{1,3}$ |
| Character 2 (Message Specific) | $u_{2,1}$ | $u_{2,2}$ | $u_{2,3}$ | $u_{2,4}$ | $u_{2,5}$ | $u_{2,6}$ | $u_{2,7}$ | $z_{2,1}$ | $z_{2,2}$ | $z_{2,3}$ |
| ... | ... | ... | ... | ... | ... | ... | ... | ... | ... | ... |
| Character $K_2$ (EOS) | $u_{K_2,1}$ | $u_{K_2,2}$ | $u_{K_2,3}$ | $u_{K_2,4}$ | $u_{K_2,5}$ | $u_{K_2,6}$ | $u_{K_2,7}$ | $z_{K_2,1}$ | $z_{K_2,2}$ | $z_{K_2,3}$ |
| Error Check Character (ECC) | $p_1^{\downarrow}$ | $p_2^{\downarrow}$ | $p_3^{\downarrow}$ | $p_4^{\downarrow}$ | $p_5^{\downarrow}$ | $p_6^{\downarrow}$ | $p_7^{\downarrow}$ | $z_{K_2+1,1}$ | $z_{K_2+1,2}$ | $z_{K_2+1,3}$ |

FIG. 4

| Character Type | Character (Encoded Symbol): $N_1 = 10$ bits<br>Formed by appending 3-bit zero count to information symbol | | | | | | | | | |
|---|---|---|---|---|---|---|---|---|---|---|
| | Information Symbol<br>$K_1 = 7$ bits | | | | | | | Zero Count<br>$N_1 - K_1 = 3$ bits | | |
| Character 1 (Format Specifier) | $u_{1,1}$ | $u_{1,2}$ | $u_{1,3}$ | $u_{1,4}$ | $u_{1,5}$ | $u_{1,6}$ | $u_{1,7}$ | $z_{1,1}$ | $z_{1,2}$ | $z_{1,3} = \bar{p}_1$ |
| Character 2 (Message Specific) | $u_{2,1}$ | $u_{2,2}$ | $u_{2,3}$ | $u_{2,4}$ | $u_{2,5}$ | $u_{2,6}$ | $u_{2,7}$ | $z_{2,1}$ | $z_{2,2}$ | $z_{2,3} = \bar{p}_2$ |
| ... | ... | ... | ... | ... | ... | ... | ... | ... | ... | ... |
| Character $K_2$ (EOS) | $u_{K_2,1}$ | $u_{K_2,2}$ | $u_{K_2,3}$ | $u_{K_2,4}$ | $u_{K_2,5}$ | $u_{K_2,6}$ | $u_{K_2,7}$ | $z_{K_2,1}$ | $z_{K_2,2}$ | $z_{K_2,3} = \bar{p}_{K_2}$ |
| Error Check Character (ECC) | $p_1^\downarrow$ | $p_2^\downarrow$ | $p_3^\downarrow$ | $p_4^\downarrow$ | $p_5^\downarrow$ | $p_6^\downarrow$ | $p_7^\downarrow$ | $z_{K_2+1,1}$ | $z_{K_2+1,2}$ | $z_{K_2+1,3}$ |

ITERATIVE DECODING TECHNIQUE SYSTEM AND METHOD FOR DIGITAL SELECTIVE CALLING

STATEMENT OF GOVERNMENT INTEREST

This invention was made with government support under Contract No. FA8802-19-C-0001 awarded by the Department of the Air Force. The government has certain rights in the invention.

FIELD

The present disclosure generally relates to the technical field of communications. More specifically, the present disclosure is directed to systems and methods for improving receiver performance in a Digital Selective Calling ("DSC") system.

BACKGROUND

Systems that monitor a situation or location for occurrence of an event, and which provide an alarm in response to the event, are well-known and are embodied in many different designs. In various traditional alert systems, devices are utilized for alerting potential rescuers in the event of a maritime overboard emergency. These devices, once activated, send a signal indicating that an emergency event has occurred. For example, some devices issue a simple alarm signal, such as a flashing light or audible signal. Activation of these devices may be automatic, such as by contact with water, or manual. The alert issued by different devices varies, and devices that issue such alerts, known as emergency position-indicating radio beacons ("EPIRBs"), are organized into several classes. Some classes of EPIRBs are capable of transmitting data, which may include the name or location of the vessel in trouble. These signals may be of the type that are monitored by a constellation of satellites, in which case the alarms are relayed to local rescue resources. Some of these devices generate special-purpose alarms, such as man overboard alarms, which can warn the crew in the event that a person falls overboard from a vessel. A transceiver on the vessel can relay the alarm to other systems, such as EPIRBs or marine radios, for rescue backup.

In the early 1970's an international committee developed and standardized the DSC. The DSC was developed to standardize a means of handling maritime communications traffic by facilitating more efficient calling and providing an automated standard distress and safety system. The motivation for developing the DSC was to relieve congestion in the very high frequency (VHF) band on the voice distress and calling channel, channel 16. DSC solves this problem because it uses channel 70, VHF frequency 156.525 Mhz, for its routine calling. DSC permits mariners to instantly send an automatically formatted distress alert to the Coast Guard or other rescue authority anywhere in the world. DSC also allows a mariner to initiate or receive distress, urgency, safety, and routine radiotelephone calls to or from any similarly-equipped vessel or shore station. DSC allows for addressing of specific other radios when transmitting the alert, and allows others to respond specifically to the caller. This capability is available because DSC may be used to designate a telephone as the terminal equipment in the DSC message, and provide the PSTN address as selection information in the data. Thus, a point-to-point distress call may be completed, even when the receiving entity is not connected to a radio loudspeaker. DSC allows for storage records of failed attempts to reach another radio, at that radio. According to the DSC standard, the distress alert has the following parameters: (a) Transmit frequency: 156.525 MHz; (b) Channel Bandwidth: 25 kHz; (c) Transmit power: ≥0.5 W EiRP; (d) Baseband modulation: Frequency-shift keying (FSK); and (e) Carrier modulation: PM.

Distress alerts can be relayed to other ships within radio range (usually up to about 30 miles) or directly to a shore station, which can forward the alert to U.S. Coast Guard rescue coordination centers (RCC). Presently, the United States Coast Guard is implementing the National Distress Response System Modernization Project (NDRSMP—also known as the 'Rescue 21' System). This emergency monitoring system relies on the DSC protocol to expand any marine distress call transmissions to both VHF channels 16 and 70. Using DSC enabled VHF marine radios, the 'Rescue 21' system provides enhanced emergency radio coverage up to 20 nautical miles from the coastline of the United States. However, the 'Rescue 21' system has coverage limitations; particularly for 'man overboard' or other emergency incidents occurring beyond the 20 nautical mile range limit of the United States coastline. Significant coverage gaps in the Rescue 21 distress system limit the United States Coast Guard's ability to rescue mariners in distress.

As discussed above, the VHF DSC transceiver facilitates distress related communications over terrestrial marine radio systems. In the event of an emergency, the VHF transmitter is used to send an automatically formatted distress alert signal to surrounding vessels and/or coastal stations of rescue authorities. The distress alert signal can include a designation specifying the nature and priority level of the call, a vessel's unique identifier (e.g., Maritime Mobile Service Identity ("MMSI")), and the vessel's position. In response to a reception of a distress alert signal, vessels and/or coastal station(s) send a DSC acknowledgement message to the vessel that transmitted the distress alert signal. The DSC acknowledgement message is received by the VHF DSC receiver.

U.S. Pat. No. 9,743,264 to Harris Corporation discloses a spaced-based DSC system that collects and processes DSC emergency messages transmitted from DSC transmitters of terrestrial radios using satellites to position validate the DSC emergency messages and determining first positions of the DSC transmitters in transit based on geolocation data and time location data respectively assigned by the satellites to the DSC emergency messages. In this system, information contained in a transmitted DSC message is used to establish a return channel communication with a transmitter using a non-maritime VHF electro-magnetic spectrum (e.g., Satcom services (Iridium) and/or free space optic services).

When developing space-based systems of communication, such as the one described above, the first step in determining feasibility of decoding the distress alerts is link budget development. Link budget is a design aid, calculated during the design of a communication system, to determine the received power and ensure that the information is received intelligibly with an adequate signal-to-noise ("SNR") ratio. An example of a simplified link budget equation is: Received Power (dB)=Transmitted Power (dB)+ Gains (dB)−Losses (dB). The goal of any link budget is to determine the SNR required for "error free" decoding at the transceiver. To determine SNR required for "error free" decoding, you must determine the (a) decoder input error rate as a function of the received SNR; and (b) the decoder input error rate yielding "error free" decoding. In other words, the key to link budget is the Carrier-to-Noise Ration (CNR) required for "error free" decoding. CNR required may be computed using the decoder input error rate as a function of the CNR received and the decoder input error rate yielding "error free" decoding.

According to the International Electrotechnical Commission ("IEC"), a DSC decoder is evaluated by determination of the symbol error rate ("SER"). The decoded DSC call sequence applied with forward error correction, interleaving techniques, and check-sum information is divided into blocks each corresponding to one information symbol in the received signal. The ratio between the numbers of incorrect blocks to the total number of blocks is determined as the symbol error rate. Presently, the standard describes that forward error correction may utilize time-diversity. Furthermore, the DSC standard only mandates that for the VHF call sequence, the receiver decoder should provide maximum utilization of the received signal, including use of the error-check character and by using an iterative decoding process with adequate memory provision.

It would be advantageous to alleviate the limitations in the current terrestrial system using space-based VHF. More specifically, it would be advantageous to provide an improved decoding technique that maximizes performance, by enabling reception of weaker signals, which improves the chances of distress alert reception and subsequent rescue of mariners in distress.

SUMMARY

According to various embodiments, a method is disclosed. The method comprises receiving at least one signal via a receiver. The at least one signal is extracted for data via a processor coupled to the receiver, wherein the data includes at least one message and a set of parameters related to the message. A signal output is generated using the at least one message and the set of parameters such that the signal output includes a first portion and a second portion. At least one error is identified in the signal output and corrected using the first portion and the second portion. An output is generated that is used to perform at least one task related to the at least one signal.

According to various embodiments, a system is disclosed. The system comprises receiving at least on signal receiver and extracting data from the at least one signal via a processor coupled to the receiver. The data includes at least one message and a set of parameters related to the message. The system further comprises generating a signal output using the at least one message and the set of parameters such that the signal output includes a first portion and a second portion, identifying at least one error in the signal output, and correcting the identified at least one error using the first portion and the second portion. The system generates an output that is used to perform at least one task related to the at least one signal.

According to various embodiments, a non-transitory computer readable medium having instructions stored thereon is disclosed. Wherein the instructions, when executed by at least one processor, cause a device to perform operations that comprise receiving at least one signal and extracting data from the at least one signal. The data includes at least one message and a set of parameters related to the message. A signal output is generated using the at least one message and the set of parameters such that the signal output includes a first portion and a second portion. Operations further comprise identifying at least one error in the signal output, correcting the identified at least one error using the first portion and the second portion, and generating an output that is used to perform at least one task related to the at least one signal.

BRIEF DESCRIPTION OF THE DRAWINGS

Various aspects of the present disclosure will be or become apparent to one with skill in the art by reference to the following detailed description when considered in connection with the accompanying exemplary non-limiting embodiments, in which.

DETAILED DESCRIPTION

This description of the exemplary embodiments is intended to be read in connection with the accompanying drawings, which are to be considered part of the entire written description. The use of the singular includes the plural unless specifically stated otherwise. The use of "or" means "and/or" unless stated otherwise. Furthermore, the use of the term "including," as well as other forms such as "includes" and "included," is not limiting. In addition, terms such as "element" or "component" encompass both elements and components comprising one unit, and elements and components that comprise more than one subunit, unless specifically stated otherwise. Additionally, the section headings used herein are for organizational purposes only, and are not to be construed as limiting the subject matter described.

The following description is provided as an enabling teaching of a representative set of examples. Many changes can be made to the embodiments described herein while still obtaining beneficial results. Some of the desired benefits discussed below can be obtained by selecting some of the features discussed herein without utilizing other features. Accordingly, many modifications and adaptations, as well as subsets of the features described herein are possible and can even be desirable in certain circumstances. Thus, the following description is provided as illustrative and is not limiting.

As used herein, use of a singular article such as "a," "an" and "the" is not intended to exclude pluralities of the article's object unless the context clearly and unambiguously dictates otherwise A novel iterative decoding system and method are provided in the present disclosure. As will be described throughout this specification, the iterative decoding system and method advantageously improves receiver performance by using a zero-based parity that casts a received DSC message into a parity check product code enabling the use of a maximum a posteriori (MAP) decoding algorithm. By enabling the reception of weaker signals, the iterative decoding technique described herein improves DSC signal recognition and subsequent rescue of mariners in distress.

Overview

Figure 1:
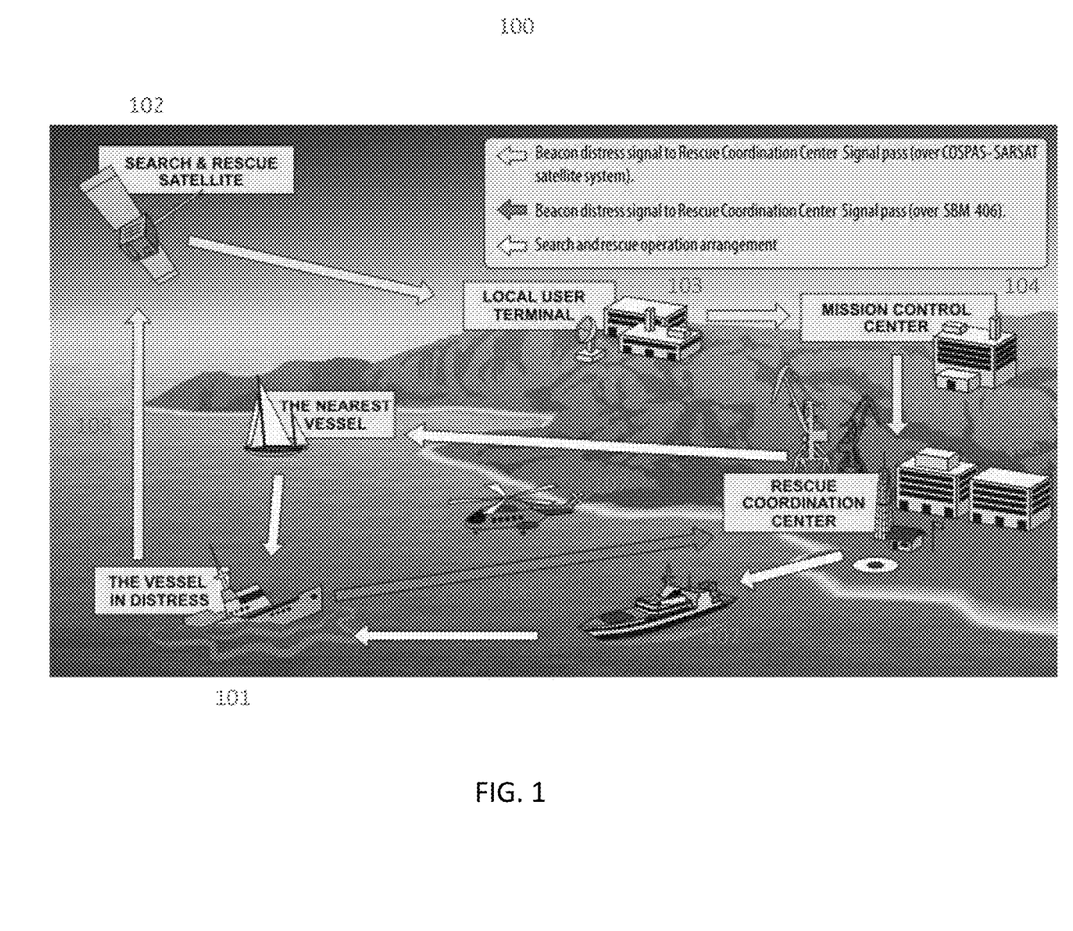
FIG. 1 depicts one example of a DSC communication flow for emergency response in accordance with some embodiments of the present disclosure.

In various embodiments, the iterative decoding system and method improve communication reception of DSC messages. FIG. 1 depicts one example of a system 100 comprising a DSC transmitter 101 (i.e. a vessel capable of transmitting a DSC message), satellite network 102, local user terminal station 103, mission control center 104, rescue coordination center 106, and a plurality of rescue vehicles 107. During operation, a DSC transmitter 101 transmits a DSC distress alert signal 108 using a VHF transceiver (not depicted in FIG. 1). As will be explained in further detail below, the DSC distress alert signal 108 consists of a pre-formatted distress message for initiating emergency communications with satellite network 102 and/or rescue coordination center 106. In accordance with various embodiments, for example as shown in FIG. 1, the DSC distress alert signal 108 is received by the satellite network 102 and processed to obtain the DSC message 109. The DSC message 109 is relayed from satellite network 102 to rescue coordination center 106 via local terminal user 103 and mission control center 104. In some embodiments, the DSC message 109 may be relayed from satellite network 102 directly to rescue coordination center 106. In some embodiments, the DSC distress alert signal 108 is transmitted directly to the rescue coordination center 106. In this embodiment, the DSC distress alert signal 108 is processed to obtain the DSC message 109 at rescue coordination center 106. It will be appreciated that a person of ordinary skill in the art would understand that the DSC message 109 may be processed or relayed to rescue coordination center 106 in a variety of ways within the scope of the present disclosure.

Remote computers (not depicted) may be part of a system 100 and gain access to satellite network 102. Access to the DSC message 109 may be gained via a communications network (not depicted) through a wireless cellular communication network, a WAN hotspot, or through a wired or wireless connection with a computer as will be understood by one skilled in the art.

DSC transmitters and receivers may include a display that displays graphics, video, text, and other data received from DSC transmitter 101 (or from a frame buffer not shown) to a user (e.g., a subscriber, commercial user, back-end user, or other user). Examples of such displays include, but are not limited to, LCD screens, OLED display, capacitive touch screen, and a plasma display, to list only a few possible displays. DSC transmitters and receivers may also include a main memory, such as a random access ("RAM") memory, and may also include a secondary memory. Secondary memory may include a more persistent memory such as, for example, a hard disk drive ("HDD") and/or removable storage drive ("RSD"), representing a magnetic tape drive, an optical disk drive, solid state drive ("SSD"), or the like. In some embodiments, the removable storage drive reads from and/or writes to a removable storage unit ("RSU") in a manner that is understood by one of ordinary skill in the art. The removable storage unit represents a magnetic tape, optical disk, or the like, which may be read by and written to by removable storage drive. As will be understood by one of ordinary skill in the art, the removable storage unit may include a tangible and non-transient machine readable storage medium having stored therein computer software and/or data.

In some embodiments, secondary memory may include other devices for allowing computer programs or other instructions to be loaded into DSC transmitters and receivers. Such devices may include, for example, a removable storage unit ("RSU") and a corresponding interface ("RSI"). Examples of such units and interfaces may include a removable memory chip (such as an erasable programmable read only memory ("EPROM")), programmable read only memory ("PROM")), secure digital ("SD") card and associated socket, and other removable storage units and interfaces, which allow software and data to be transferred from the removable storage unit to the DSC transmitters or receivers.

DSC transmitters and receivers may also include one or more communication interfaces, which allows software and data to be transferred between each other and external devices such as, for example, another DSC transmitter or receiver, a computer, and other devices that may be locally or remotely connected to system 100. Examples of the one or more communication interfaces may include, but are not limited to, a modem, a network interface (such as an Ethernet card or wireless card), a communications port, a Personal Computer Memory Card International Association ("PCMCIA") slot and card, one or more Personal Component Interconnect ("PCI") Express slot and cards, or any combination thereof. The one or more communication interfaces may also include a wireless interface configured for short-range communication, such as near field communication ("NFC"), Bluetooth, or other interface for communication via another wireless communication protocol. As briefly noted above, one of ordinary skill in the art will understand that computers and portions of system 100 may include some or all components of DSC transmitters and receivers described herein.

Software and data transferred via the one or more communications interfaces are in the form of signals, which may be electronic, electromagnetic, optical, or other signals capable of being received by communications interfaces. These signals are provided to the communications interface via a communications path or channel. The channel may be implemented using wire or cable, fiber optics, a telephone line, a cellular link, a radio frequency ("RF") link, or other communication channels.

In this document, the terms "non-transitory computer program medium" and "non-transitory computer readable medium" refer to media such as removable storage units, or a hard disk installed in hard disk drive. These computer program products provide software to DSC transmitters and receivers. Computer programs (also referred to as "computer control logic") may be stored in main memory and/or secondary memory. Computer programs may also be received via the one or more communications interfaces. Such computer programs, when executed by a processor(s), enable the DSC transmitters and receivers to perform the features of the method discussed herein.

DSC transmitters and receivers may include one or more tangible, non-transitory memories that store data and/or software instructions, and one or more processors configured to execute software instructions. DSC transmitters and receivers may include one or more display devices that display information to a user and one or more input devices (e.g., keypad, keyboard, touchscreen, voice activated control technologies, or any other suitable type of known input device) to allow the user to input information to the DSC transmitter or receiver. DSC transmitters or receivers may include a processor(s) which may be any central processing unit ("CPU"), microprocessor, micro-controller, or computational device or circuit for executing instructions. Processor(s) are connected to a communication infrastructure (e.g., a communications bus, cross-over bar, or network). Various software embodiments are described in terms of this exemplary DSC transmitter or receiver. After reading this description, it will be apparent to one of ordinary skill in the art how to implement the method using a DSC transceiver and receiver that includes other systems or architectures.

In an embodiment where the system 100 or method is partially or entirely implemented using software, the software may be stored in a computer program product and loaded into the DSC transmitter or receiver using removable storage drive, hard drive, and/or communications interface. The software, when executed by processor(s), causes the processor(s) to perform the functions of the method described herein. In another embodiment, the method is implemented primarily in hardware using, for example, hardware components such as application specific integrated circuits ("ASICs"). Implementation of the hardware state machine so as to perform the functions described herein will be understood by persons skilled in the art. In yet another embodiment, the method is implemented using a combination of both hardware and software.

Iterative Decoding Technique for DSC

Figure 2:
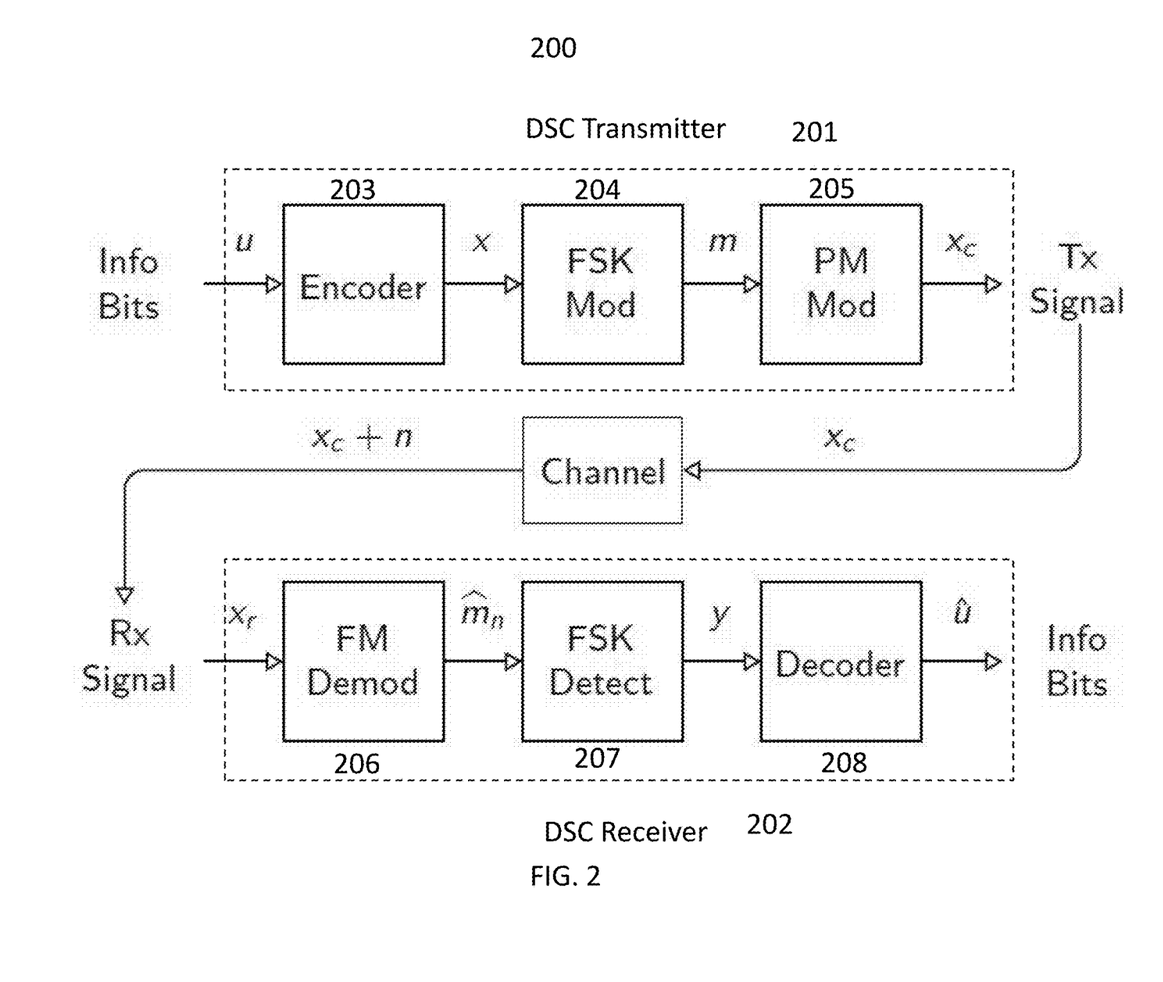
FIG. 2 illustrates one example of DSC transmit/receive architecture in accordance with some embodiments of the present disclosure.

FIG. 2 illustrates one example of DSC transmit/receive architecture 200 in accordance with some embodiments of the present disclosure. According to various embodiments and in reference to FIG. 2, the DSC transmit/receive architecture 200 comprises a DSC transmitter 201 and a DSC receiver 202. In some embodiments, DSC transmitter 201 transmits a signal via an encoder 203, FSK modulator 204, and a phase modulator 205. In various embodiments, the transmission from DSC transmitter 201 is transmitted on a VHF channel. As illustrated in FIG. 2, DSC receiver 202 receives a transmission on a VHF channel. In various embodiments, DSC receiver 202 processes a received transmission via a frequency demodulator 206, a FSK detector 207 and a decoder 208. In various embodiments, DSC receiver 202 processes a received signal to generate a DSC message 109.

Figure 3:
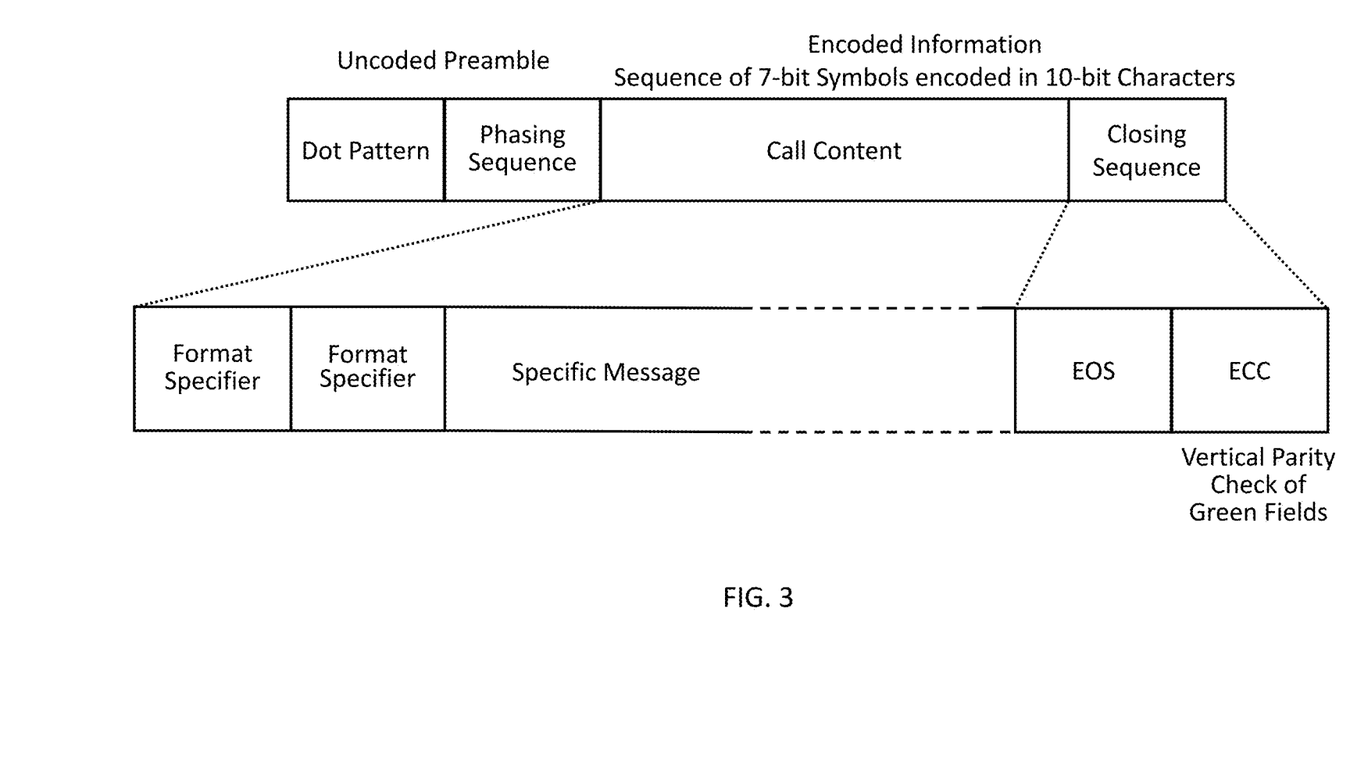
FIG. 3 illustrates an example of a VHF DSC call sequence format in accordance with some embodiments of the present disclosure.

FIG. 3 illustrates an example of a VHF DSC call sequence format in accordance with some embodiments of the present disclosure. According to various embodiments, the VHF DSC call sequence comprises an uncoded preamble having a dot pattern phasing sequence and an encoded information segment having a call content and close sequence portions. In this embodiment, the call content portion of the message comprises a format specifier and a DSC message 109. Furthermore, the closing sequence comprises an end of sequence (EOS) character and an error-check character (ECC). According to various embodiments, the EOS character is transmitted three times in the first transmission of a DSC call sequence and once in the retransmission of a DSC call sequence. In various embodiments, the ECC character is the final character transmitted and it serves to check the entire sequence for the presence of errors which are undetected by the ten-unit error-detecting code and the time diversity employed in the VHF DSC call sequence.

Figure 4:
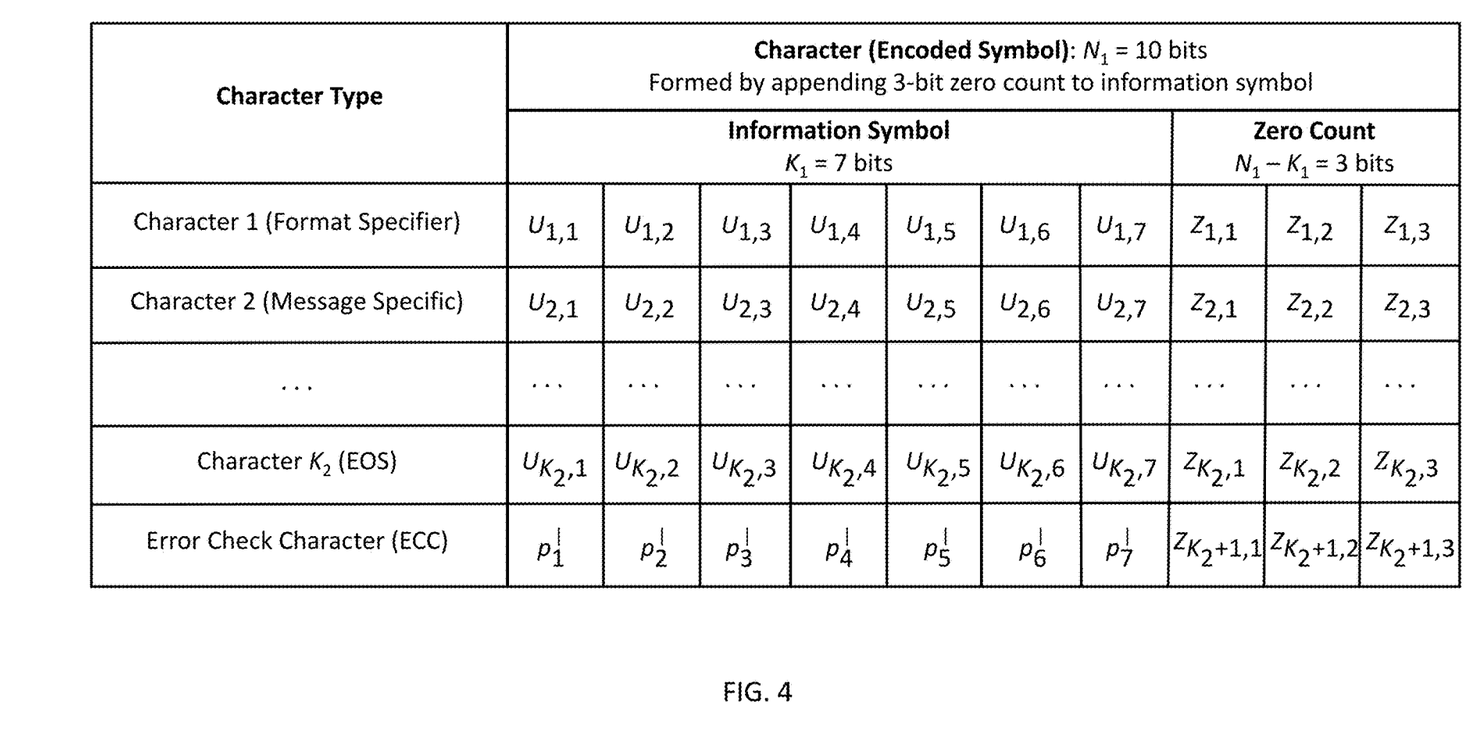
FIG. 4 illustrates an example of a VHF DSC call sequence encoded message structure in accordance with some embodiments of the present disclosure.

FIG. 4 illustrates an example of a VHF DSC call sequence encoded message (10-bit) structure in accordance with some embodiments of the present disclosure. According to various embodiments, the format specifier (i.e., Character 1) in FIG. 4 is transmitted twice in both the first transmission and retransmission. The format specifier indicates the type of DSC message that is being transmitted (e.g. "distress" alert, "all ships" call, selective call to group of ships, selective call to a particular station, etc.). In various embodiments, the message specific portion (i.e., Character 2) of the DSC call sequence encoded message structure includes message information relating to the DSC message. By way of example, the message specific portion may include the nature of the distress, distress coordinates, time, type of communication, etc.

According to various embodiments, the decoder 208 shall use word recognition for the purposes of word synchronization. In this embodiment, word synchronization is the stage at which the decoder 208 is able to recognize that the dot pattern has completed and the 10-bit words of the message (i.e., information symbol and zero count) have started. In some embodiments, upon word synchronization, the decoder 208 shall use the 3-bit zero count to check the 7-bit information symbol of all received words. The 7-bit symbol shall be considered received in error if the 3-bit zero count is incorrect. In some embodiments, the decoder 208 shall reject the message if the format symbol cannot be received in any of its four positions error free.

Figure 5:
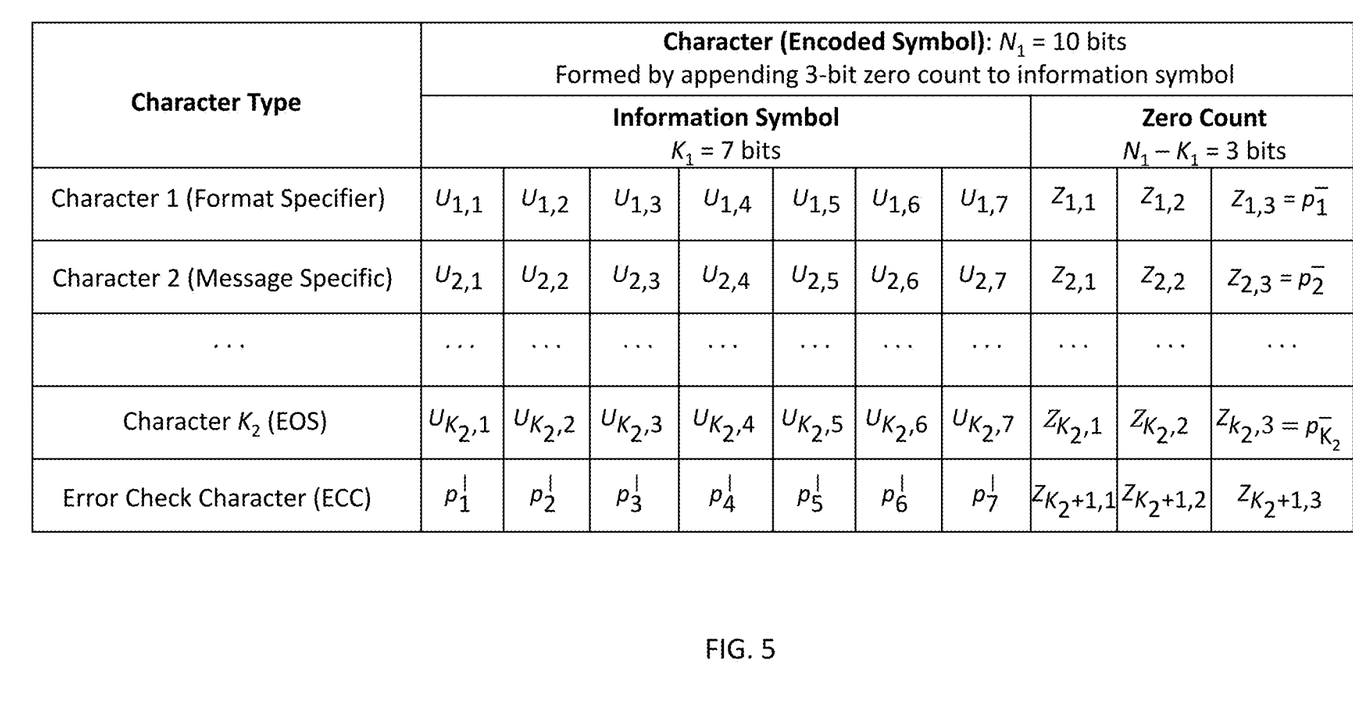
FIG. 5 illustrates an example of a VHF DSC call sequence encoded message structure with zero-based parity interpretation in accordance with some embodiments of the present disclosure.

According to the present disclosure, a parity bit may be used in the zero count to improve forward error correction of the DSC message. A standard parity bit takes on the value of zero (or one) based on whether the sum of the information bits is even (or odd). In various embodiments, the DSC zero count (3-bit) is computed as a binary sum of the information bits (7-bit) provided the sum is over the complement of the information bits. In this embodiment, the least significant bit of the zero count (3-bit) is interpreted by the decoder 208 as a zero-based parity bit. FIG. 5 illustrates an example of a VHF DSC call sequence encoded message structure with zero-based parity interpretation in accordance with some embodiments of the present disclosure.

Figure 6:
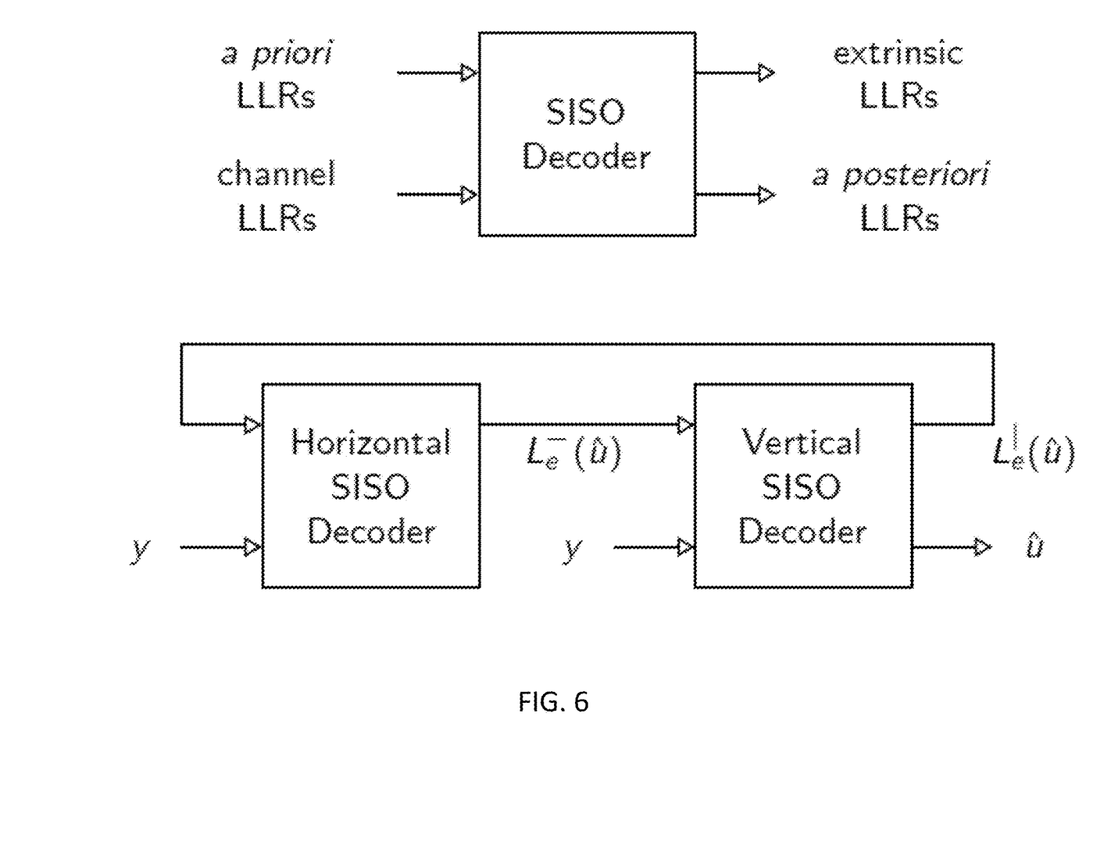
FIG. 6 illustrates one example of a maximum a posteriori decoder block diagram in accordance with some embodiments of the present disclosure.

According to various embodiments of the present disclosure, a maximum a posteriori (MAP) decoding algorithm can be developed when the least significant bit in the zero count (3-bit) is interpreted as a zero-based parity bit. FIG. 6 illustrates one example of a MAP decoder block diagram in accordance with some embodiments of the present disclosure. In various embodiments as depicted in FIG. 6, the MAP decoder comprises two Soft-Input Soft-Output (SISO) decoders. In some embodiments, the SISO decoders iteratively decode the received message. In this embodiment, each SISO decoder is given direct information about the transmitted bits through the FSK detector 207 soft decisions. The SISO decoders extract extrinsic information from the indirect transmission via the parity code identified in the zero count least significant bit.

Figure 7:
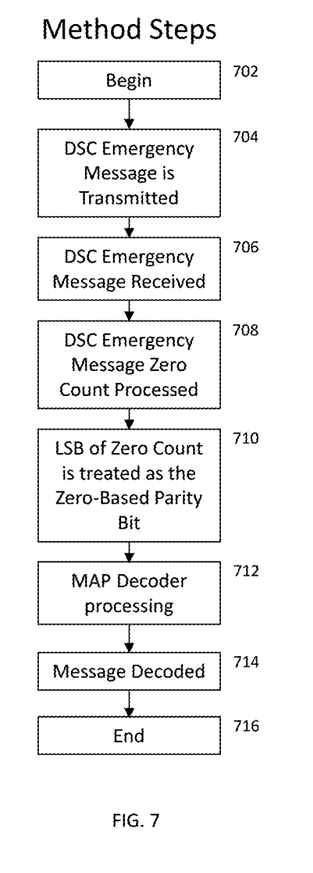
FIG. 7 is a flow diagram of an exemplary method for iterative decoding of a DSC signal.
Figure 8:
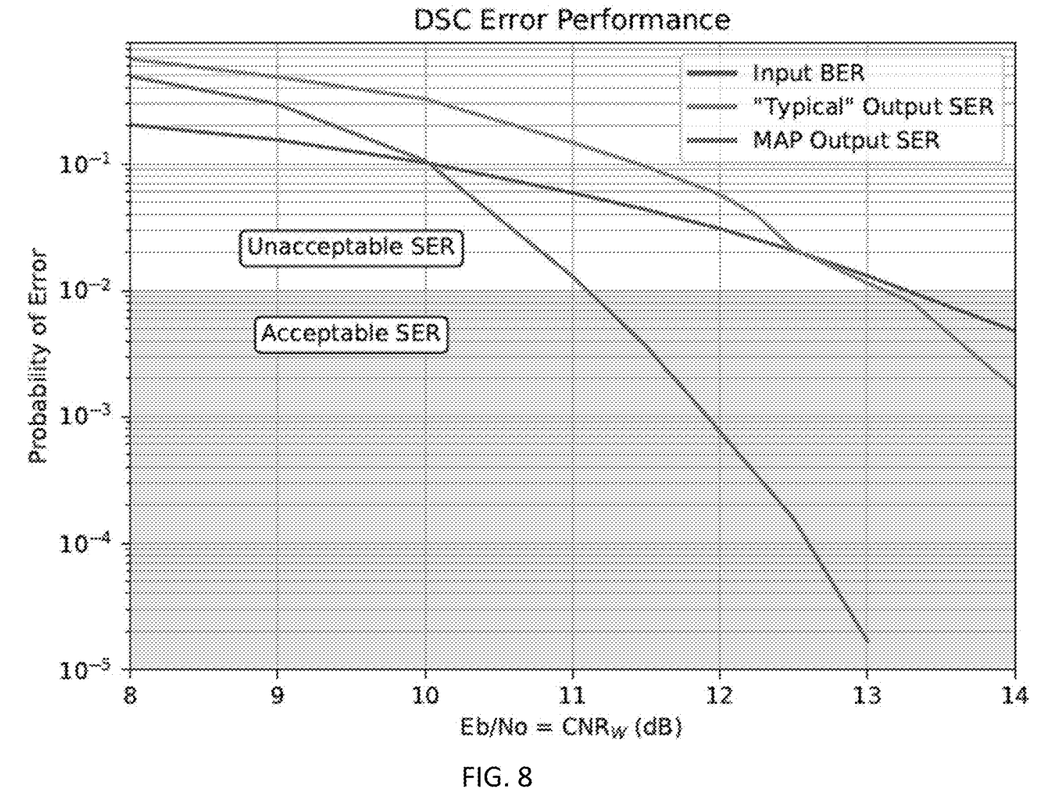
FIG. 8 illustrates an example DSC decoder input vs. output error performance in accordance with some embodiments of the present disclosure.

FIG. 7 is a flow diagram of an exemplary method for iterative decoding of a DSC signal. As shown in FIG. 7, a method 700 begins with step 702 and continues with step 704 where a DSC emergency message is transmitted (e.g., from vessel 101 of FIG. 1). The DSC emergency message is received by a receiver in step 706. At step 708, the DSC emergency message zero count is processed as a binary sum of the information bits. At step 710, the least significant bit of the zero count is a zero-based parity bit resulting from the binary sum of the information bits. At step 712, a MAP decoder iteratively decodes the received message. Upon completion of decoding the received DSC emergency message at step 712, step 714 is performed where the method 700 ends 716 or other processing is performed.

The present disclosure can be embodied in the form of methods and apparatus for practicing those methods. The present disclosure can also be embodied in the form of program code embodied in tangible media, such as secure digital ("SD") cards, USB flash drives, diskettes, CD-ROMs, DVD-ROMs, Blu-ray disks, hard drives, or any other non-transitory machine-readable storage medium, wherein, when the program code is loaded into and executed by a machine, such as a computer, the machine becomes an apparatus for practicing the disclosure. The present disclosure can also be embodied in the form of program code, for example, whether stored in a storage medium, loaded into and/or executed by a machine, or transmitted over some transmission medium, such as over electrical wiring or cabling, through fiber optics, or via electromagnetic radiation, wherein, when the program code is loaded into and executed by a machine, such as a computer, the machine becomes an apparatus for practicing the disclosure. When implemented on a general-purpose processor, the program code segments combine with the processor to provide a unique device that operates analogously to specific logic circuits.

It may be emphasized that the above-described embodiments, are merely possible examples of implementations, and merely set forth a clear understanding of the principles of the disclosure. Many variations and modifications may be made to the above-described embodiments of the disclosure without departing substantially from the spirit and principles of the disclosure. All such modifications and variations are intended to be included herein within the scope of this disclosure and the present disclosure and protected by the following claims.

While this specification contains many specifics, these should not be construed as limitations on the scope of any disclosure or of what may be claimed, but rather as descriptions of features that may be specific to particular embodiments of particular disclosures. Certain features that are described in this specification in the context of separate embodiments may also be implemented in combination in a single embodiment. Conversely, various features that are described in the context of a single embodiment may also be implemented in multiple embodiments separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

While various embodiments have been described, it is to be understood that the embodiments described are illustrative only and that the scope of the subject matter is to be accorded a full range of equivalents, many variations and modifications naturally occurring to those of skill in the art from a perusal hereof.

What is claimed is:

1. A method, comprising:
   receiving at least one signal via a receiver;
   extracting data from the at least one signal via a processor coupled to the receiver, the data includes at least one message and a set of parameters related to the at least one message;
   generating a signal output using the at least one message and the set of parameters such that the signal output includes a first portion and a second portion;
   identifying at least one error in the signal output with a zero-based parity;
   correcting the identified at least one error using the first portion and the second portion; and
   generating an output that is used to perform at least one task related to the at least one signal.

2. The method of claim 1, wherein the at least one signal is a Digital Selective Calling (DSC) emergency message.

3. The method of claim 1, wherein identifying errors is performed using a maximum a posteriori (MAP) decoder comprising at least two Soft-Input Soft-Output (SISO) decoders.

4. The method of claim 3, wherein each SISO decoder is given direct information about transmitted bits of a Digital Selective Calling (DSC) emergency message through a Frequency-shift keying (FSK) detector soft decisions.

5. The method of claim 4, wherein each SISO decoder extracts extrinsic information from indirect transmission via a zero-based parity bit.

6. The method of claim 2, is transmitted wherein the DSC emergency message using a very high frequency (VHF) transceiver.

7. The method of claim 6, wherein the DSC emergency message comprises a call setup message from a terrestrial radio.

8. A system comprising:
   receiving at least one signal via a receiver;
   extracting data from the at least one signal via a processor coupled to the receiver, the data includes at least one message and a set of parameters related to the at least one message;
   generating a signal output using the at least one message and the set of parameters such that the signal output includes a first portion and a second portion;
   identifying at least one error in the signal output with a zero-based parity;
   correcting the identified at least one error using the first portion and the second portion; and
   generating an output that is used to perform at least one task related to the at least one signal.

9. The system of claim 8, wherein the at least one signal is a Digital Selective Calling (DSC) emergency message.

10. The system of claim 8, wherein identifying errors is performed using a maximum a posteriori (MAP) decoder comprising at least two Soft-Input Soft-Output (SISO) decoders.

11. The system of claim 10, wherein each SISO decoder is given direct information about transmitted bits of a Digital Selective Calling (DSC) emergency message through a Frequency-shift keying (FSK) detector soft decisions.

12. The system of claim 11, wherein each SISO decoder extracts extrinsic information from indirect transmission via a zero-based parity bit.

13. The system of claim 9, wherein the DSC emergency message is transmitted a very high frequency (VHF) transceiver.

14. The system of claim 9, wherein the DSC emergency message comprises a call setup message from a terrestrial radio.

15. A non-transitory computer readable medium having instructions stored thereon, wherein the instructions, when executed by at least one processor, cause a device to perform operations that comprise:
   receive at least one signal via a receiver; and
   extract data from the at least one signal, the data includes at least one message and a set of parameters related to the at least one message;

generate a signal output using the at least one message and the set of parameters such that the signal output includes a first portion and a second portion;

identify at least one error in the signal output with a zero-based parity;

correct the identified at least one error using the first portion and the second portion; and generate an output that is used to perform at least one task related to the at least one signal.

16. The non-transitory computer readable medium of claim 15, wherein the at least one signal is a Digital Selective Calling (DSC) emergency message.

17. The non-transitory computer readable medium of claim 15, wherein identifying errors is performed using a maximum a posteriori (MAP) decoder comprising at least two Soft-Input Soft-Output (SISO) decoders.

18. The non-transitory computer readable medium of claim 17, wherein each SISO decoder is given direct information about transmitted bits of a Digital Selective Calling (DSC) emergency message through a Frequency-shift keying (FSK) detector soft decisions.

19. The non-transitory computer readable medium of claim 18, wherein each SISO decoder extracts extrinsic information from indirect transmission via a zero-based parity bit.

20. The method of claim 1, wherein identifying the at least one error with a zero-based parity is performed using a least significant bit of a zero count portion of the signal output as a zero-based parity bit.

* * * * *